(12) United States Patent
Lee et al.

(10) Patent No.: US 7,504,014 B2
(45) Date of Patent: Mar. 17, 2009

(54) HIGH DENSITY INTERCONNECTIONS WITH NANOWIRING

(75) Inventors: Michael G. Lee, San Jose, CA (US); Kishio Yokouchi, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 857 days.

(21) Appl. No.: 11/080,195

(22) Filed: Mar. 15, 2005

(65) Prior Publication Data
US 2006/0211327 A1    Sep. 21, 2006

(51) Int. Cl.
*C25D 5/02*    (2006.01)
(52) U.S. Cl. ..................... 205/118; 205/122
(58) Field of Classification Search ........... 205/118, 205/122; 204/450
See application file for complete search history.

(56) References Cited

U.S. PATENT DOCUMENTS

| | | | |
|---|---|---|---|
| 2002/0130311 A1* | 9/2002 | Lieber et al. | 257/1 |
| 2004/0173378 A1* | 9/2004 | Zhou et al. | 174/260 |
| 2006/0022342 A1* | 2/2006 | Fukutani et al. | 257/758 |

* cited by examiner

*Primary Examiner*—Nam X Nguyen
*Assistant Examiner*—Luan V Van
(74) *Attorney, Agent, or Firm*—Baker Botts L.L.P.

(57) ABSTRACT

The present invention generally relates to circuits on the nanotechnology scale. Specifically, it is directed to methods of fabricating carbon nanotube-based (i.e., CNT-based) circuits. The method involves providing a mixture of carbon nanotubes that is substantially disaggregated and patterning carbon nanotubes through the use of electrostatic forces. Carbon nanotubes in the mixture are typically disaggregated through the introduction of positive charge on the individual nanotubes. The patterning of the carbon nanotubes is typically accomplished using electrostatic attraction between pre-formed metal lines and the charged carbon nanotubes.

7 Claims, 7 Drawing Sheets

200

HIGH DENSITY INTERCONNECTIONS WITH NANOWIRING

FIELD OF THE INVENTION

The present invention generally relates to circuits on the nanotechnology scale. Specifically, it is directed to methods of fabricating carbon nanotube-based (i.e., CNT-based) circuits.

BACKGROUND OF THE INVENTION

Nanotechnology involves the creation of materials by methodically organizing and manipulating matter on a scale of several to one hundred or more nanometers. Such materials, which include components, devices and systems, are oftentimes desirable and exploitable due to the novel properties that result from manipulation at that scale.

The focus of nanotechnology is fundamentally different from that of a related field—micro-technology. Micro-technology has been primarily directed to taking macro-scale devices and making them smaller. Examples of micro-technology efforts include the translation of vacuum tubes into solid state transistors and the conversion of electrical-mechanical systems into MEMS (i.e., Micro ElectroMechanical Systems). This direction is typically referred to as the "top-down" approach. Miniaturization in nanotechnology, in contrast, is a distinct but secondary, advantageous result. Nanotechnology is a "bottom-up" approach: Materials are tailored at the molecular or atomic level, which results in dramatic and systematic property changes; ones that have never been seen or even thought of at the macro scale.

One can also vary fundamental material properties (e.g., melting temperature, hardness and light dispersion) without changing chemical composition or molecular structure through patterning matter on the nanometer scale. This can allow the production of materials with completely novel specifications and characteristics. Such characteristics should provide for alternative approaches in the production of smaller, lighter, and cheaper devices with better functionality.

A variety of nanomaterials and nanotechnologies (e.g., nanocomposites, nanocrystals, nanoparticles, nanostructured materials, nanotubes, nanocatalysts and nanofilters) have been examined with a host of applications in mind. Envisioned applications include: giant magnetoresistance with nanocrystalline materials; nanolayers with selective optical barriers or hard coatings; chemical and biological sensors; advanced drug delivery systems; chemical-mechanical polishing with nanoparticle slurries; new generations of lasers; nanostructured catalysts; systems on a chip; thermal barriers; and, recording media.

In the area of microelectronics and computers, the fabrication of nanocircuits could significantly reduce routing length and dramatically increase computing capability and data speed. This is due to closer distances in both the planar dimension and layer to layer height. Shortening routing length always decreases electric resistance, as described by Ohm's Law. Unfortunately, decreasing wire diameter always increases electric resistance. This makes the construction of nanocircuits using ordinary wiring materials impractical.

There is accordingly a need for new materials making and novel methods for producing nanocircuits. That is an object of the present invention.

SUMMARY OF THE INVENTION

The present invention generally relates to circuits on the nanotechnology scale. Specifically, it is directed to methods of fabricating carbon nanotube-based (i.e., CNT-based) circuits.

The method involves providing a mixture of carbon nanotubes that is substantially disaggregated and patterning carbon nanotubes through the use of electrostatic forces.

The carbon nanotubes in the mixture are typically disaggregated through the introduction of positive charge on the individual nanotubes. Positive charge may be introduced in a variety of ways, but it is typically produced by exposing the nanotubes to an electrolyte solution having an suitably acidic pH.

The patterning of the carbon nanotubes is typically accomplished using electrostatic attraction between pre-formed metal lines and the charged carbon nanotubes. Pre-formed metal lines may either be continuous or discontinous (i.e., segmented).

DETAILED DESCRIPTION

Carbon nanotubes (i.e., CNTs) are widely studied nanomaterials that exhibit excellent properties for various applications. In contrast to metal nanowires, CNTs can exhibit good electrical conductivity even in the nanoscale. This important phenomenon is illustrated if one views the CNTs as graphite laminates rolled into tubular shapes. The conduction of electric current is still in the planar dimension of the graphite laminates (i.e., the longitudinal direction of the carbon nanotubes). Shrinking the diameter of the nanotube to the nanoscale accordingly has little to no affect on conduction. Processing CNT connections using traditional methodologies, however, has proven difficult.

Figure 1:
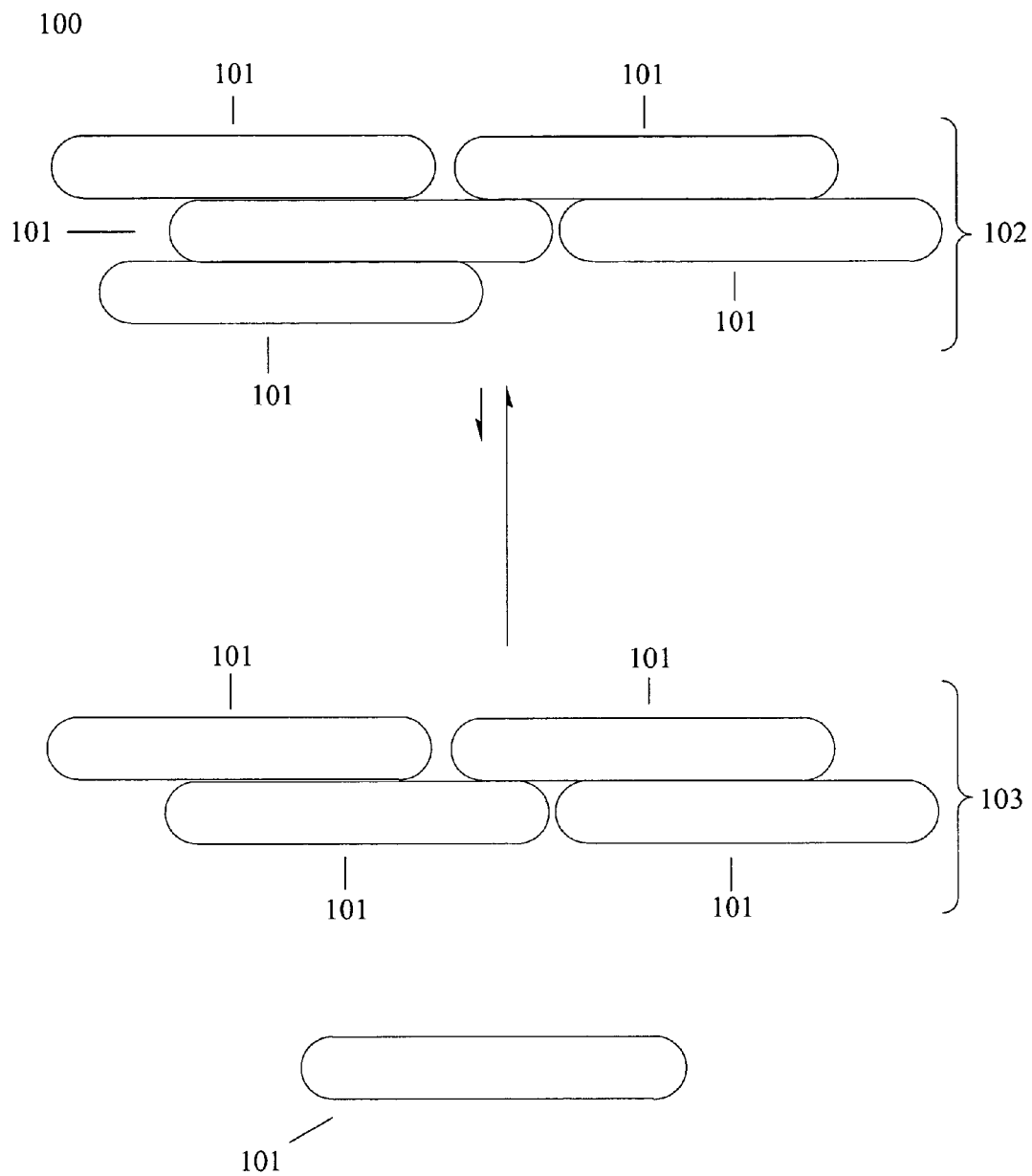
FIG. 1 shows an aggregation/disaggregation process for carbon nanotubes.

CNTs are usually fabricated in the vapor phase using methods such as electric arc discharge, laser vaporization, and chemical vapor deposition (i.e., CVD). Like graphite, CNTs are intrinsically uncharged. This physical property, along with the other molecular features, causes CNTs to aggregate and tangle together into "ropes" due to strong van der Waals forces between the molecules. FIG. 1 illustrates such aggregation. Individual CNTs (101) aggregate to form a CNT bundle (102). Bundle 102 is in equilibrium with a smaller CNT bundle (103) and individual CNT 101. The equilibrium lies far toward bundle 102 due to the strong attractive forces between the molecules.

Figure 2:
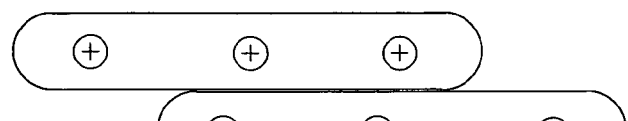
FIG. 2 shows and aggregation/disaggregation process for positively charged carbon nanotubes.
Figure 2:
Figure 2:
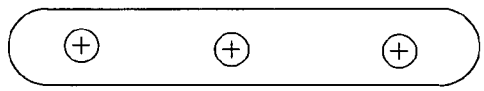
Figure 2:
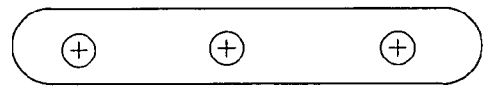

The present invention, at least in its first step, provides a method to substantially disaggregate CNTs in a mixture (e.g., solution or suspension). This process is illustrated by FIG. 2. By creating like-charged CNTs, the generated repulsive force overcomes the attractive van der Waal forces at play. For instance, aggregate 201 is in equilibrium with individual CNTs 202. The aggregation equilibrium, represented by the arrows in FIG. 2 is shifted to individual CNTs 202 because the mutually positively charged species repel one another.

Charged CNTs are typically generated by immersing CNTs in a solution that is sufficiently acidic such that charged CNTs result. The degree of charge will depend on the exact characteristics of the solution employed. Where the degree of charge affords a repulsive force that can overcome van der Waals attraction, then CNT disaggregation will occur. Should the repulsive force only partially overcome the existing molecular attraction, then a mixture of CNT bundles will be formed. Typically, either individual charged CNTs or relatively small CNT bundles can be used in the present invention.

The solutions in which the CNT immersion occurs include a solvent and at least one acidic element. Nonlimiting examples of solvents include organic solvents, inorganic solvents and water (e.g., electrolyte solution). Acidic elements present in the solution may be organic or inorganic acids that are compatible with the chosen solvent.

Once the CNTs are immersed in the appropriate solution, reaction to produce charged species is facilitated by agitating the mixture. Agitation may be produced in a variety of ways, including, for example, shaking a closed container, stirring through the using of mechanical means, or by forcing a gas through the mixture.

Figure 3:
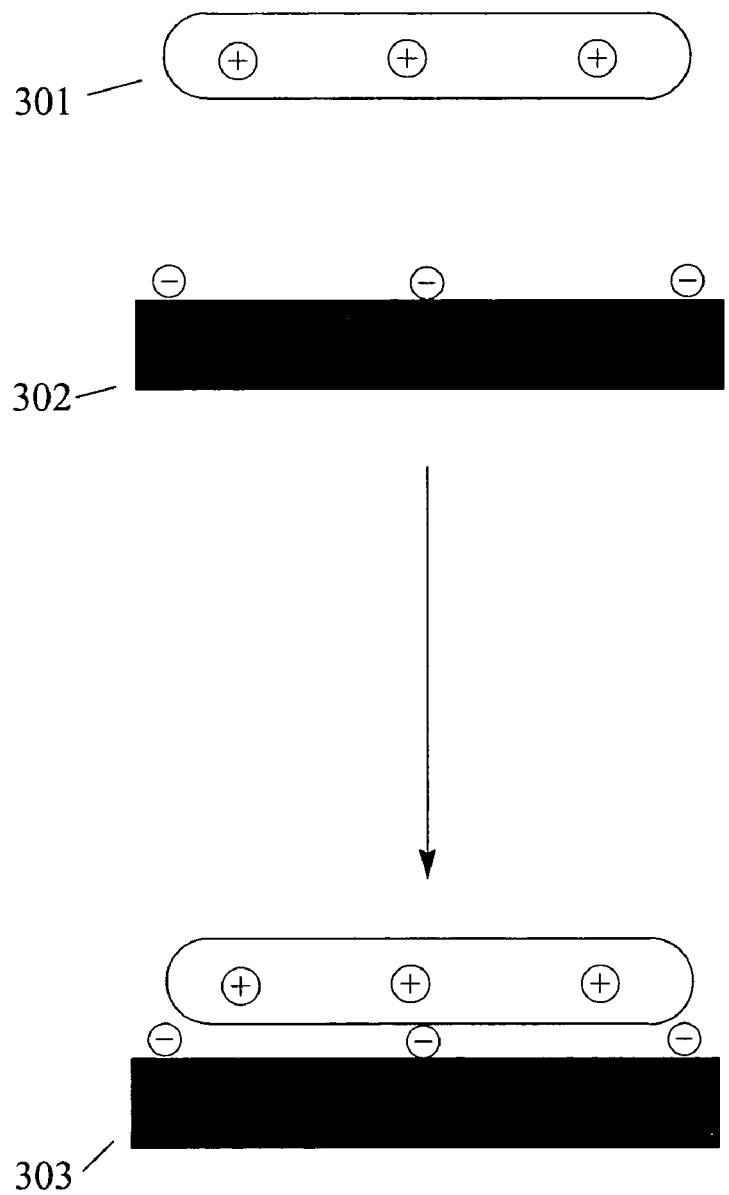
FIG. 3 shows the attraction between, and subsequent combination of, a charged carbon nanotube and a metal segment to which electric bias has been applied.

To construct a nanocircuit, the charged, disaggregated CNTs must be patterned. Patterning is achieved using electrostatic attraction between pre-formed metal lines and the charged CNTs. Advanced lithography may be used to produce metal lines on a substrate having a width in the tens of nanometers. Electric bias is applied to the metal lines, which causes the charged CNTs to align on top of them. This process is illustrated in FIG. 3. Disaggregated, charged CNT 301 is brought in proximity to metal line 302, to which electric bias has been applied. The negatively charged wire (302) attracts CNT 301. This attraction results in contact product 303, a portion of the patterned circuit.

Figure 4A:
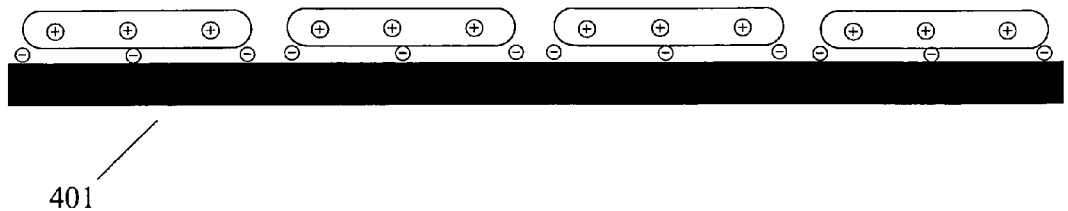
FIG. 4A shows the patterning of charged carbon nanotubes along a continuous metal line.
Figure 4B:
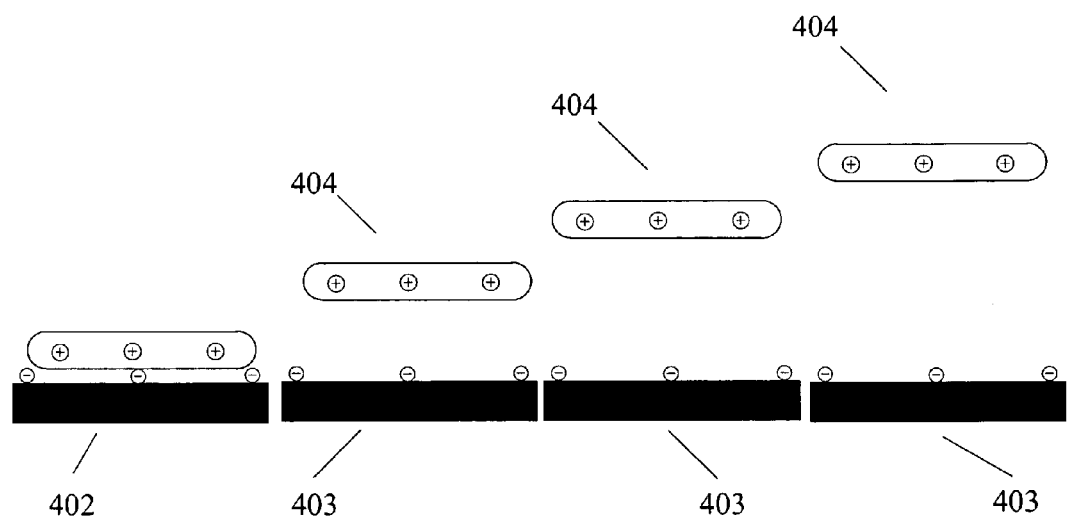
FIGS. 4B and 4C show the patterning of charged carbon nanotubes along metal segments using the application of a sweeping bias.
Figure 4C:
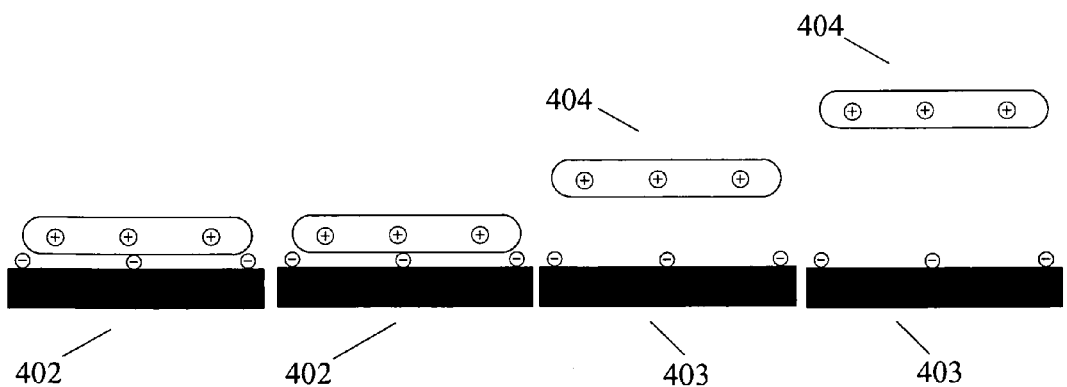

The extension of the process shown in FIG. 3 is deposition of charged CNTs along a continous metal line. This is shown as 401 in FIG. 4A. One may also employ a sweeping bias that is applied in a cyclic manner through wire segments, as shown in FIGS. 4B and 4C. Individual CNTs (404) are sequentially attracted to wire segments 403 to produce combination products 402. Voltage bias, cyclic time, and waveform are suitably controlled to achieve orderly placement of CNTs on metal traces.

When the metal segments are populated with CNTs, the patterning is done. The metal segments may stay underneath the CNTs. Alternatively, the patterned CNTs may be transferred to a second substrate where the actual circuits will be. In such a way, the metal segments on the first substrate can be used repeatedly as a template many times; the second substrate only contains CNTs, with no underlying metal segments.

Figure 5A:
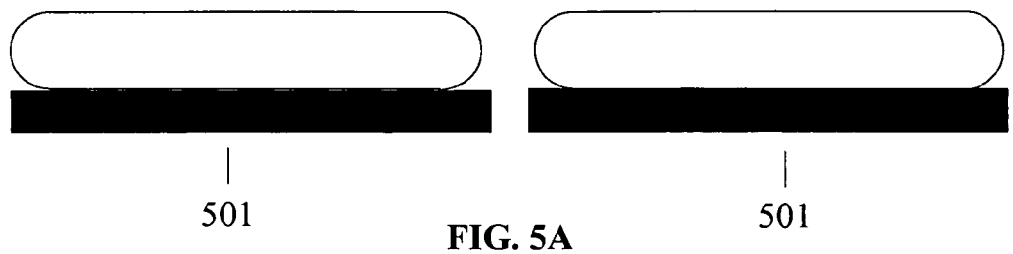
FIG. 5A shows carbon nanotube/wire segment combinations containing a gap between them.
Figure 5B:
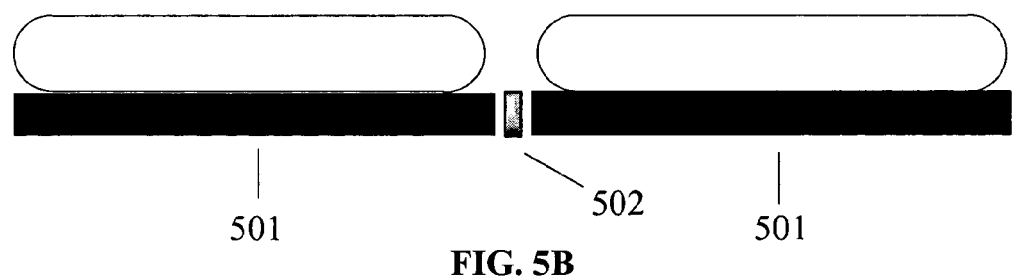
FIG. 5B shows the gap of FIG. 5A which has been filed with a conducting material or bridge.
Figure 5C:
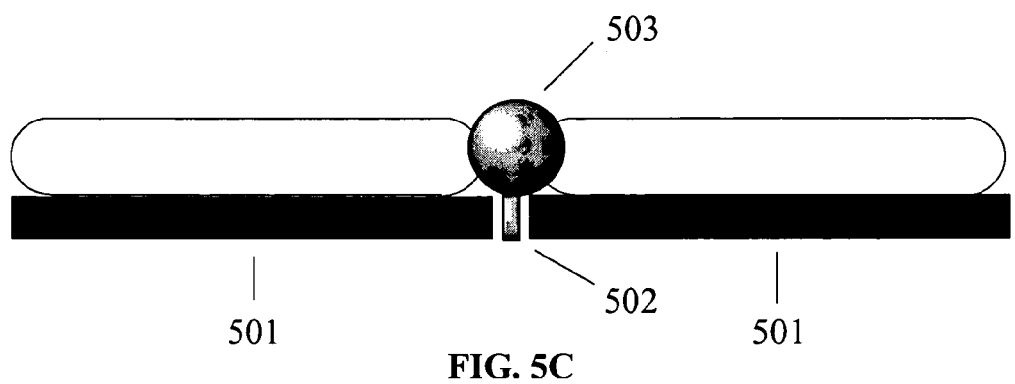
FIG. 5C shows the structure of FIG. 5B which has been further filled with metal that is connecting the two charged nanotubes.

There may be instances where gaps will occur between deposited CNTs. This is illustrated in FIG. 5A. CNT/segment combinations 501 are in proximity, but they are not touching. Should the gap be wide enough, electrical conduction could be detrimentally affected. One approach to filling the gap involves inserting a conducting bridge (502, FIG. 5B) between the wire segments. Bridges may be of any conducting material, including, but not limited to, conductive polymers, conducting adhesive with metal filling, and deposited metals. Where bridge 502 is a metal, it is typically produced through electodeposition onto a pattern of nano-wire segments. Alternatively, bridge 502 may be a tiny metal dot placed between the segments using nanoscale lithography.

Where bridges 502 are employed, only the metal segments are biased during CNT deposition. Once CNT deposition is complete, the CNT suspension is replaced with an electrolyte containing ions (e.g., copper or nickel ions) for electrodeposition. Electrodeposition provides electroplated "bumps" (503) that serve to connect the gapped CNTS (see FIG. 5C).

Figure 6:
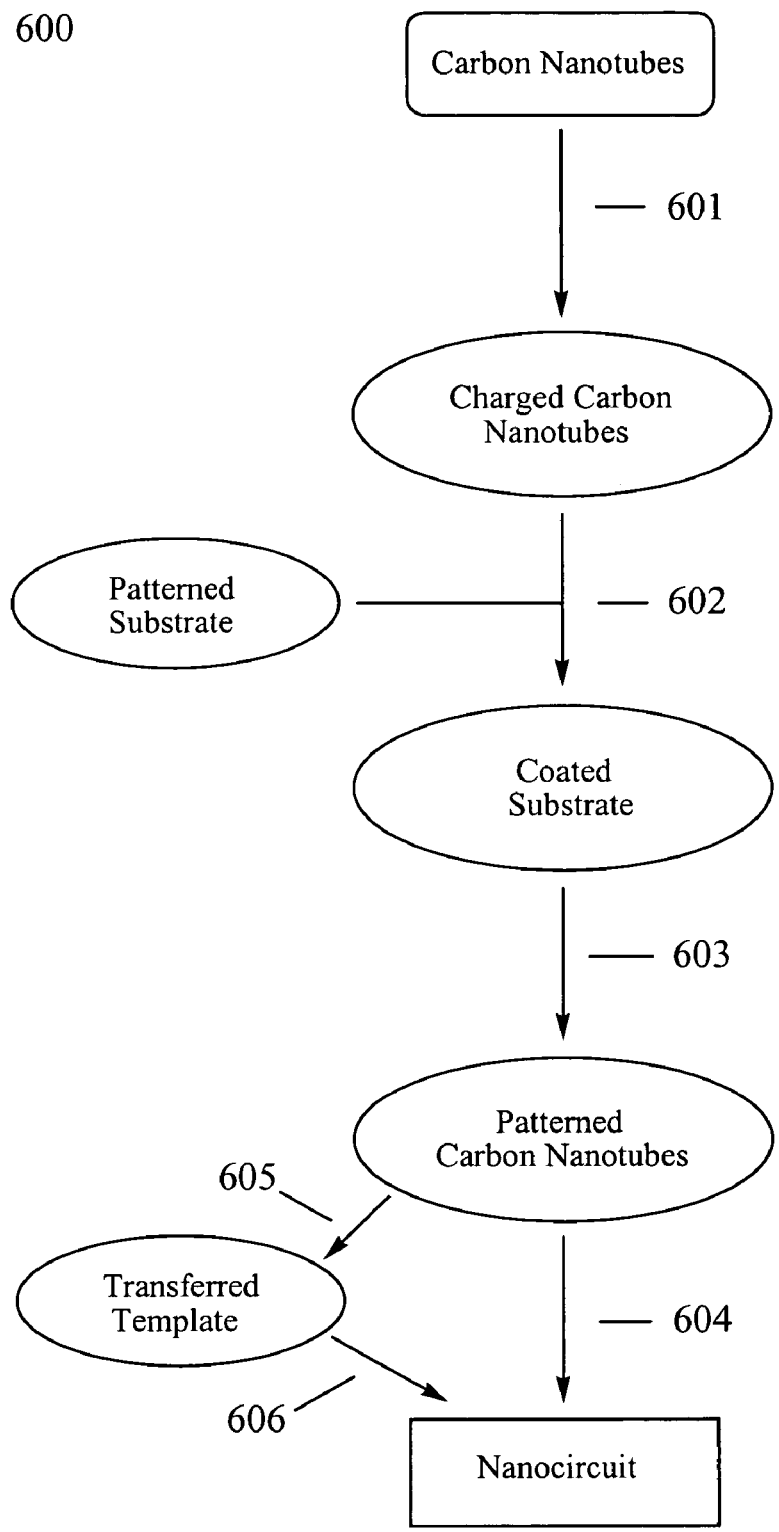
FIG. 6 shows a method of forming a nanocircuit using charged nanotubes.
Figure 7:
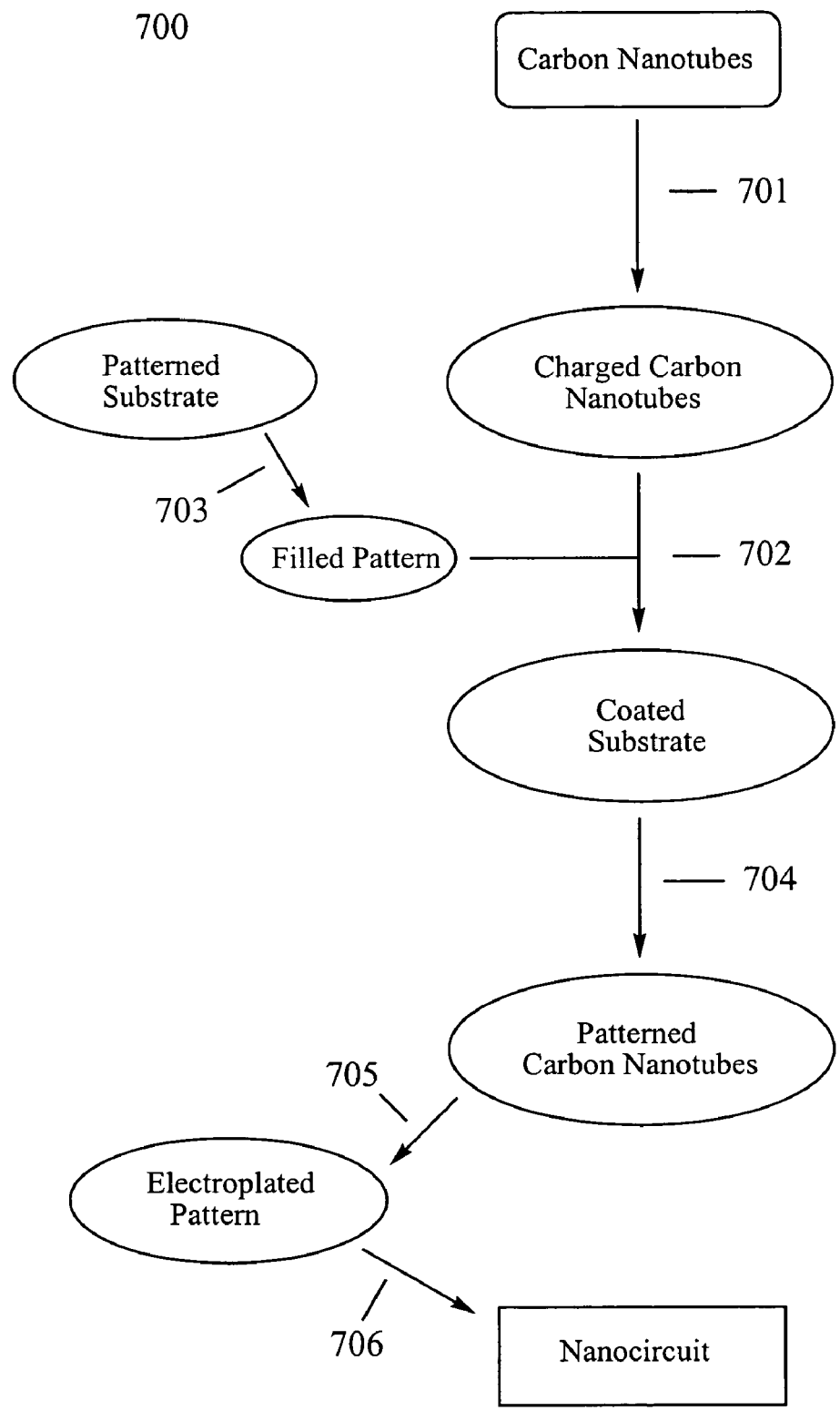
FIG. 7 shows a method of forming a nanocircuit using charged nanotubes, where the method involves bridging the gaps between nanotube/wire segment combinations.

The methods of the present invention are further described in reference to FIGS. 6 and 7. Scheme 600 illustrates one embodiment. Carbon nanotubes are immersed in an acidic solution, step 601, which provides positively charged CNTs. The positively charged CNTs are brought into contact with a patterned substrate in step 602 to provide a patterned substrate coated with a CNT suspension. An electric bias is applied to the patterned substrate in step 603, which causes the charged CNTs to align overtop the patterned nanowires. If the electric bias is simply removed, as in step 604, a nanocircuit is provided. Alternatively, the electric bias may be removed to provide a template in step 605, which produces a nanocircuit after transfer of the patterned CNTs (step 606).

Scheme 700 of FIG. 7 illustrates a modified process according to the present invention. Carbon nanotubes are immersed in an acidic solution (step 601) to provide charged CNTs. The charged CNTs are brought into contact with a patterned substrate in step 702. The substrates of the patterned substrate were previously filled with a conducting material (step 703). An electric bias is applied to the filled-patterned substrate in step 704, which causes the charged CNTs to align overtop the patterned nanowires. The CNT suspension is replaced with an ion containing electrolyte solution and electrodeposition is performed (step 705). The electric bias is removed in step 706, accordingly producing a nanocircuit.

We claim:

1. A method for manufacturing a carbon nanotube-based nanocircuit, the method comprising:
   immersing carbon nanotubes in a solution to provide a suspension of charged nanotubes;
   contacting the suspension with a substrate, wherein the substrate is patterned with metallic nanowire segments;
   applying an electrical bias to the metallic nanowire segments, thereby causing at least one charged carbon nanotube to align with at least one segment; and
   replacing the carbon nanotube suspension with an electrolyte containing ions; and
   performing electrodeposition using the electrolyte to provide metal connections between carbon nanotubes.

2. The method according to claim 1, wherein the solution comprises a solvent and an acidic element.

3. The method according to claim 1, wherein the charged nanotubes are substantially disaggregated in the suspension.

4. The method according to claim 1, wherein the method further comprises the step of:
removing the electric bias to provide a substrate containing a carbon nanotube pattern overlaying the metallic nanowire segments;
transferring the carbon nanotube pattern to a second substrate.

5. The method according to claim 1, wherein gaps between the metallic nanowire segments are filled with bridges comprising a conductive material.

6. The method according to claim 5, wherein the conductive material is a conductive polymer, a conductive adhesive with metal filling, or a deposited metal.

7. The method according to claim 1, wherein the ions of the electrolyte are copper or nickel ions.

\* \* \* \* \*